(12) United States Patent
Cao

(10) Patent No.: US 11,244,965 B2
(45) Date of Patent: Feb. 8, 2022

(54) THIN FILM TRANSISTOR AND MANUFACTURING METHOD THEREFOR, ARRAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventor: Binbin Cao, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/768,232

(22) PCT Filed: Oct. 25, 2019

(86) PCT No.: PCT/CN2019/113338
§ 371 (c)(1),
(2) Date: May 29, 2020

(87) PCT Pub. No.: WO2020/088368
PCT Pub. Date: May 7, 2020

(65) Prior Publication Data
US 2020/0295054 A1    Sep. 17, 2020

(30) Foreign Application Priority Data
Oct. 29, 2018   (CN) .......................... 201811270397.0

(51) Int. Cl.
*H01L 27/12*     (2006.01)
*H01L 29/417*    (2006.01)
*H01L 29/786*    (2006.01)

(52) U.S. Cl.
CPC ........ *H01L 27/1237* (2013.01); *H01L 27/127* (2013.01); *H01L 27/1233* (2013.01);
(Continued)

(58) Field of Classification Search
CPC ............. H01L 29/78636; H01L 29/458; H01L 29/78618; H01L 29/41733; H01L 29/66765; H01L 29/78696; H01L 29/4908
See application file for complete search history.

(56) References Cited

U.S. PATENT DOCUMENTS

2003/0124851 A1    7/2003   Jo et al.
2009/0039352 A1*   2/2009   Kobayashi ........ H01L 29/78696
                                                   257/59
(Continued)

FOREIGN PATENT DOCUMENTS

CN      101090123 A     12/2007
CN      101764065 A     6/2010
(Continued)

OTHER PUBLICATIONS

Office Action dated May 28, 2020 in Chinese Application No. 201811270397.0.
(Continued)

*Primary Examiner* — Mohammed R Alam
(74) *Attorney, Agent, or Firm* — McDermott Will and Emery LLP

(57) ABSTRACT

A thin film transistor, comprising a substrate, an active layer disposed on the substrate, and a source and drain that make electrical contact with the active layer, wherein the source and drain each comprise a first sub-electrode and a second sub-electrode that are stacked along a thickness of the active layer, and the first sub-electrode is closer to the active layer relative to the second sub-electrode. An area of an overlapping region between an orthographic projection of the
(Continued)

second sub-electrode of at least one of the source and drain on the substrate and an overlapping region between an orthographic projection of the first sub-electrode of the at least one of the source and the drain on the substrate and the orthographic projection of the active layer on the substrate.

13 Claims, 12 Drawing Sheets

(52) U.S. Cl.
CPC .... *H01L 27/1251* (2013.01); *H01L 29/41733* (2013.01); *H01L 29/78618* (2013.01)

(56) References Cited

U.S. PATENT DOCUMENTS

| | | | |
|---|---|---|---|
| 2009/0294781 A1 | 12/2009 | Kim et al. | |
| 2011/0212569 A1 | 9/2011 | Yamazaki et al. | |
| 2014/0073093 A1* | 3/2014 | Farmer | H01L 29/78678 438/158 |
| 2016/0300899 A1* | 10/2016 | Zhang | H01L 29/42384 |
| 2020/0295054 A1 | 9/2020 | Cao | |

FOREIGN PATENT DOCUMENTS

| | | |
|---|---|---|
| CN | 101894760 A | 11/2010 |
| CN | 102763203 A | 10/2012 |
| CN | 203312302 U | 11/2013 |
| CN | 106997903 A | 8/2017 |
| CN | 109390413 A | 2/2019 |

OTHER PUBLICATIONS

Office Action dated Nov. 27, 2020 in Chinese Application No. 201811270397.0.

* cited by examiner

THIN FILM TRANSISTOR AND MANUFACTURING METHOD THEREFOR, ARRAY SUBSTRATE AND DISPLAY DEVICE

CROSS-REFERENCE TO RELATED APPLICATIONS

This application is a national phase entry under 35 USC 371 of International Patent Application No. PCT/CN2019/113338 filed on Oct. 25, 2019, which claims priority to and the benefit of Chinese Patent Application No. 201811270397.0, filed with the China National Intellectual Property Administration on Oct. 29, 2018, and entitled "A THIN FILM TRANSISTOR AND MANUFACTURING METHOD THEREFOR, ARRAY SUBSTRATE AND DISPLAY DEVICE", the contents of which are incorporated herein by reference in their entirety.

TECHNICAL FIELD

The present disclosure relates to the field of electronic devices, and in particular, to a thin film transistor and a manufacturing method therefor, an array substrate and a display device.

BACKGROUND

As a common electronic device, a thin film transistor (abbreviated as TFT) is widely applied in the electronic field. The thin film transistor usually includes a gate, an active layer, a source and a drain. In some related technologies, each of the source and the drain of the thin film transistor has a structure of double-layer metal.

SUMMARY

In one aspect, a thin film transistor is provided. The thin film transistor includes: a substrate, an active layer disposed on the substrate, and a source and a drain that are in electrical contact with the active layer. The source and the drain each include a first sub-electrode and a second sub-electrode that are stacked along a thickness of the active layer, and the first sub-electrode is closer to the active layer relative to the second sub-electrode. An area of an overlapping region between an orthographic projection of the second sub-electrode of at least one of the source and the drain on the substrate and an orthographic projection of the active layer on the substrate is less than an area of an overlapping region between an orthographic projection of the first sub-electrode of at least one of the source and the drain on the substrate and the orthographic projection of the active layer on the substrate.

In some embodiments, the active layer includes: a first contact portion in electrical contact with the first sub-electrode of the source, a second contact portion in electrical contact with the first sub-electrode of the drain and a non-contact portion located between the first contact portion and the second contact portion. A distance in a first direction, between an edge of the second sub-electrode of the source proximate to the non-contact portion and each of at least some regions on an edge of the second sub-electrode of the drain proximate to the non-contact portion is greater than a length of the non-contact portion in the first direction. The first direction is a direction parallel to the substrate and pointing to the second contact portion from the first contact portion.

In some embodiments, a distance, in the first direction, from any position on an edge of the second sub-electrode of the at least one of the source and the drain proximate to the non-contact portion to an edge of the non-contact portion proximate to the second sub-electrode of the at least one of the source and the drain proximate to the non-contact portion is greater than zero.

In some embodiments, the distance, in the first direction, from any position on the edge of the second sub-electrode of the at least one of the source and the drain proximate to the non-contact portion to the edge of the non-contact portion proximate to the second sub-electrode of the at least one of the source and the drain proximate to the non-contact portion is equal.

In some embodiments, in a case where in the first direction, the distance from any position on the edge of the second sub-electrode of the source proximate to the non-contact portion to an edge of the non-contact portion proximate to the edge of the second sub-electrode of the source is equal, and the distance from any position on the edge of the second sub-electrode of the drain proximate to the non-contact portion to an edge of the non-contact portion proximate to the edge of the second sub-electrode of the drain is equal, in the first direction, the distance from the edge of the second sub-electrode of the source proximate to the non-contact portion to the edge of the non-contact portion proximate to the edge of the second sub-electrode of the source is equal to the distance from the edge of the second sub-electrode of the drain proximate to the non-contact portion to the edge of the non-contact portion proximate to the edge of the second sub-electrode of the drain.

In some embodiments, the distance from the edge of the second sub-electrode of the at least one of the source and the drain proximate to the non-contact portion to the edge of the non-contact portion proximate to the edge of the second sub-electrode of the at least one of the source and the drain is 2 μm to 7 μm.

In some embodiments, a distance, in the first direction, from the edge of the second sub-electrode of at least one of the source and the drain proximate to the non-contact portion to an edge of the non-contact portion proximate to the edge of the second sub-electrode of the at least one of the source and the drain is greater than or equal to a length of a corresponding contact portion in the first direction, wherein the corresponding contact portion is a contact portion of the first contact portion and the second contact portion closest to the second sub-electrode.

In some embodiments, the second sub-electrode of the at least one of the source and the drain has at least one hollow-out portion, and an orthographic projection of the at least one hollow-out portion on the substrate is within a range of the orthographic projection of the active layer on the substrate.

In some embodiments, the thin film transistor further comprises a gate and a gate insulating layer, along a direction pointing to the active layer from the substrate, the gate and the gate insulating layer disposed between the substrate and the active layer.

In some embodiments, a material of the second sub-electrode includes at least one of copper, aluminum and silver.

In another aspect, an array substrate is provided. The array substrate includes the thin film transistor in any one of the foregoing embodiments.

In yet another aspect, a display device is provided. The display device includes the array substrate in the foregoing embodiment.

In yet another embodiment, a method for manufacturing a thin film transistor is provided. The method includes: forming an active layer above a substrate; and forming a source and a drain on the substrate above which the active layer has been formed. The source and the drain are separately in electrical contact with the active layer; the source and the drain each include a first sub-electrode and a second sub-electrode that are stacked along a thickness of the active layer, and the first sub-electrode is closer to the active layer relative to the second sub-electrode. An area of an overlapping region between an orthographic projection of the second sub-electrode of at least one of the source and the drain and an orthographic projection of the active layer on the substrate is less than an area of an overlapping region between an orthographic projection of the first sub-electrode of the at least one of the source and the drain and the orthographic projection of the active layer on the substrate.

In some embodiments, before the forming an active layer on a substrate, the method further includes: forming a gate and a gate insulating layer on the substrate sequentially.

In some embodiments, forming the source and the drain on the substrate above which the active layer has been formed includes: sequentially forming a first conductive layer and a second conductive layer on the substrate above which the active layer has been formed; patterning the first conductive layer and the second conductive layer through a first patterning process to form an initial source and an initial drain, wherein the initial source and the initial drain each include a first sub-electrode formed out of the first conductive layer and an initial second sub-electrode formed out of the second conductive layer; forming an etch stop layer on the substrate above which the initial source and the initial drain have been formed; grinding the etch stop layer though a grinding process, or patterning the etch stop layer through a second patterning process, so as to expose surfaces of portions, which overlap the active layer, of initial second sub-electrodes of the initial source and the initial drain; and etching the initial second sub-electrodes of the initial source and the initial drain respectively through the exposed surfaces through an etching process to form the source and the drain, wherein the source and the drain each include the first sub-electrode and the second sub-electrode that is formed out of the initial second sub-electrode.

In some embodiments, in a case where the etch stop layer is ground through the grinding process, the grinding process includes at least one of a chemical grinding process and a mechanical grinding process.

In some embodiments, in a process of etching the initial second sub-electrodes of the initial source and the initial drain, an etching liquid used is capable of reacting with the initial second sub-electrode but not with the first sub-electrode.

In some embodiments, in a process of etching the initial second sub-electrodes of the initial source and the initial drain, by controlling etching parameters, a distance, in a direction pointing to the second sub-electrode of the source from the second sub-electrode of the drain, from each of edges of the second sub-electrodes of the source and the drain formed proximate to a non-contact portion of the active layer that is not in contact with first sub-electrodes of the source and the drain to a corresponding edge of the non-contact portion proximate to a corresponding second sub-electrodes in the source and the drain is 2 μm to 7 μm; and the etching parameters include at least one of an etching rate and an etching time.

In some embodiments, forming the source and the drain on the substrate above which the active layer has been formed includes: forming a first conductive layer on the substrate above which the active layer has been formed; patterning the first conductive layer through a third patterning process to form the first sub-electrodes of the source and the drain; forming a second conductive layer on the substrate on which the first sub-electrodes of the source and the drain have been formed; and patterning the second conductive layer through a fourth patterning process to form the second sub-electrodes of the source and the drain.

BRIEF DESCRIPTION OF THE DRAWINGS

In order to describe technical solutions in embodiments of the present disclosure more clearly, the accompanying drawings required to describe the embodiments are briefly described below. Obviously, the accompanying drawings described below are merely some embodiments of the present disclosure. A person of ordinary skill in the art may obtain other accompanying drawings according to these accompanying drawings.

DETAILED DESCRIPTION

Some embodiments of the present disclosure are described below with reference to the accompanying drawings. Obviously, the described embodiments are merely some but not all of embodiments of the present disclosure. All other embodiments made on the basis of the embodiments of the present disclosure by a person of ordinary skill in the art shall fall within the protection scope of the present disclosure.

Unless otherwise defined, technical terms or scientific terms used in the embodiments of the present disclosure should be ordinary meanings understood by a person of ordinary skill in the field to which the present disclosure belongs. Terms such as "First", "second" and the like used in the embodiments of the present disclosure do not indicate any sequence, quantity or importance, but are merely used to distinguish between different components. Terms such as "include", "comprise" or the like mean that elements or objects appearing before the word cover elements or objects and their equivalents listed after the word, but do not exclude other elements or objects. Terms such as "connected" or "connection" is not limited to a physical or mechanical connection, but may include an electrical connection, whether direct or indirect. "Up", "down", "left", "right" or the like is only used to indicate a relative relationship of positions. When an absolute position of a described object changes, the relative relationship of positions may also change accordingly.

In addition, "and/or" appearing in the present disclosure is merely an association relationship describing associated objects, and indicates that there may be three relationships: A exists alone, A and B exist simultaneously and B exists alone. Here, the character "/" in this article indicates that associated objects before and after are in an "or" relationship.

Figure 1:
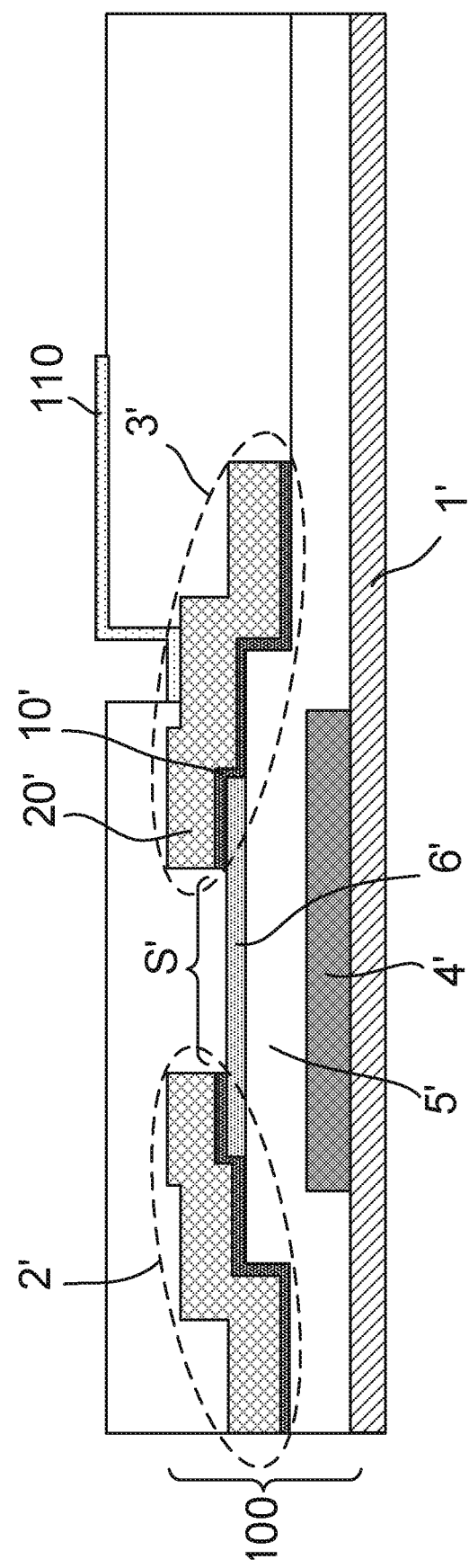
FIG. 1 is a schematic cross-sectional view showing a structure of a thin film transistor according to a related technology.

As shown in FIG. 1, a thin film transistor 100 connected to a pixel electrode 110 in an array substrate is taken as an example, and an active layer 6' of the thin film transistor 100 has contact portions in contact with a source 2' and a drain 3' respectively. In this way, when the thin film transistor 100 is in a turned-on state, a channel can be formed in the active layer 6' between the source 2' and the drain 3'. Herein, regions in which orthographic projections of the contact portions on the substrate 1' are located are overlapping regions between both orthographic projections of the source 2' and the drain 3' and an orthographic projection of the active layer 6' on the substrate 1'.

In some examples, each of the source 2' and the drain 3' of the thin film transistor 100 has a structure of double-layer metal. That is, each of the source 2' and the drain 3' includes a first sub-electrode 10' and a second sub-electrode 20' that are stacked. Herein, the first sub-electrode 10' is closer to the active layer 6' relative to the second sub-electrode 20'. The second sub-electrode 20' may be made of a metal material with relatively high conductivity, and the first sub-electrode 10' may be made of a metal material that has a relatively good effect of bonding with the active layer 6'.

A thickness of the first sub-electrode 10' is approximately 5 Å, and a thickness of the second sub-electrode 20' may reach 4000 Å and above. In other words, the thickness of the first sub-electrode 10' is much less than the thickness of the second sub-electrode 20', which may cause metal atoms of the second sub-electrode 20' to pass through the first sub-electrode 10' easily and diffuse into the active layer 6' of the thin film transistor 100 longitudinally, so that the metal atoms of the second sub-electrode 20' laterally diffuse into the channel region S' of the active layer 6', which adversely affect the characteristics of the thin film transistor 100. For example, the diffusion into the channel region S' reduces stability of the thin film transistor 100 or reduces an on-state current of the thin film transistor 100.

Herein, the channel region S' is a region in which a channel is formed in the active layer 6' when the thin film transistor 100 is in the turned-on state.

Figure 2:
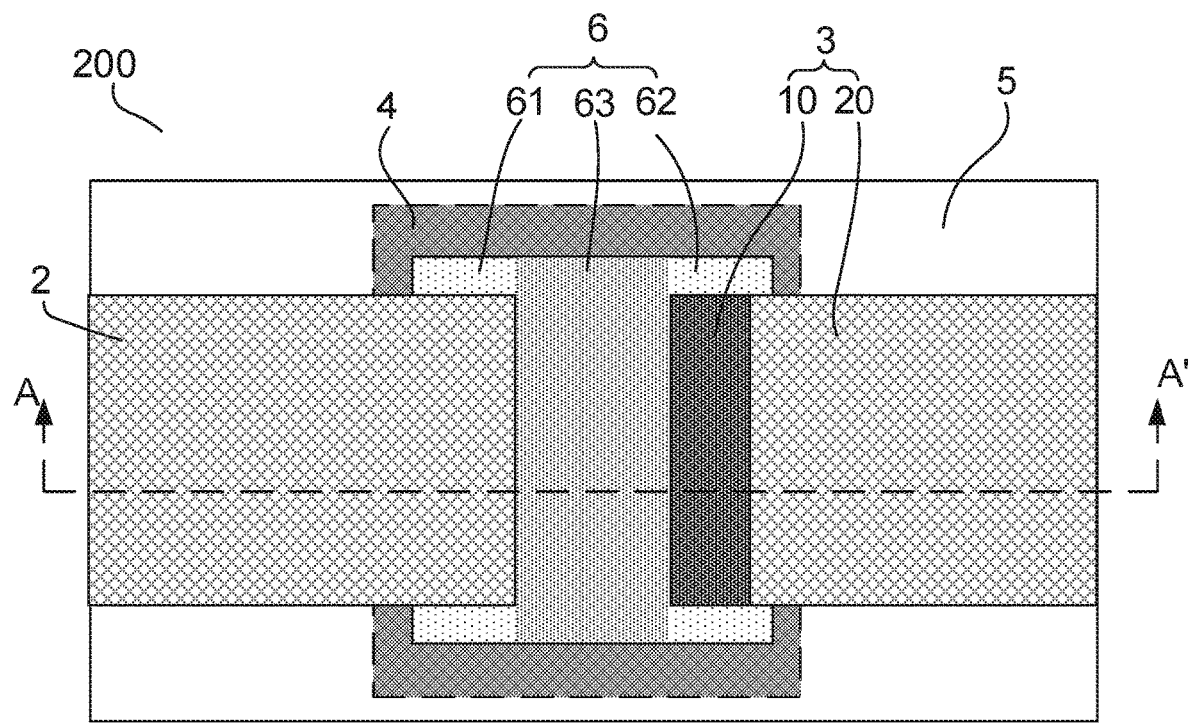
FIG. 2 is a schematic plan view showing a structure of a thin film transistor according to some embodiments of the present disclosure.
Figure 3A:
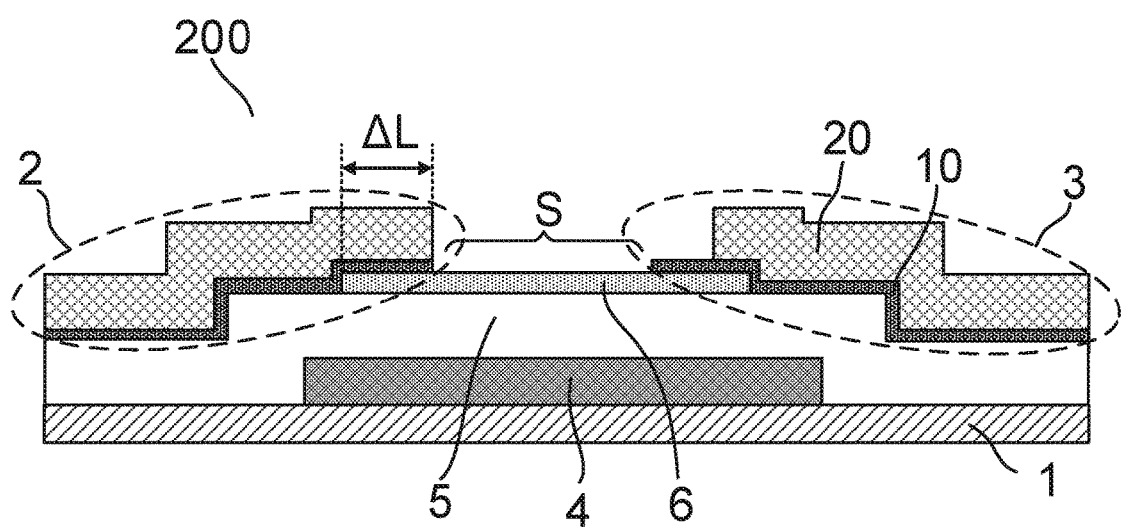
FIG. 3a is a schematic cross-sectional view showing a structure of the thin film transistor shown in FIG. 2 taken along dashed line AA'.

In some embodiments of the present disclosure, a thin film transistor 200 is provided. As shown in FIGS. 2 and 3a, the thin film transistor 200 includes: an active layer 6 disposed on a substrate 1, and a source 2 and a drain 3 that are in electrical contact with the active layer 6. Each of the source 2 and the drain 3 includes a first sub-electrode 10 and a second sub-electrode 20 that are stacked, and the first sub-electrode 10 is closer to the active layer 6 relative to the second sub-electrode 20.

An area of an overlapping region between an orthographic projection of the second sub-electrode 20 of at least one of the source 2 and the drain 3 on the substrate 1 and an orthographic projection of the active layer 6 on the substrate 1 is less than an area of an overlapping region between an orthographic projection of the first sub-electrode 10 of the at least one of the source 2 and the drain 3 on the substrate 1 and the orthographic projection of the active layer 6 on the substrate 1.

Figure 7:
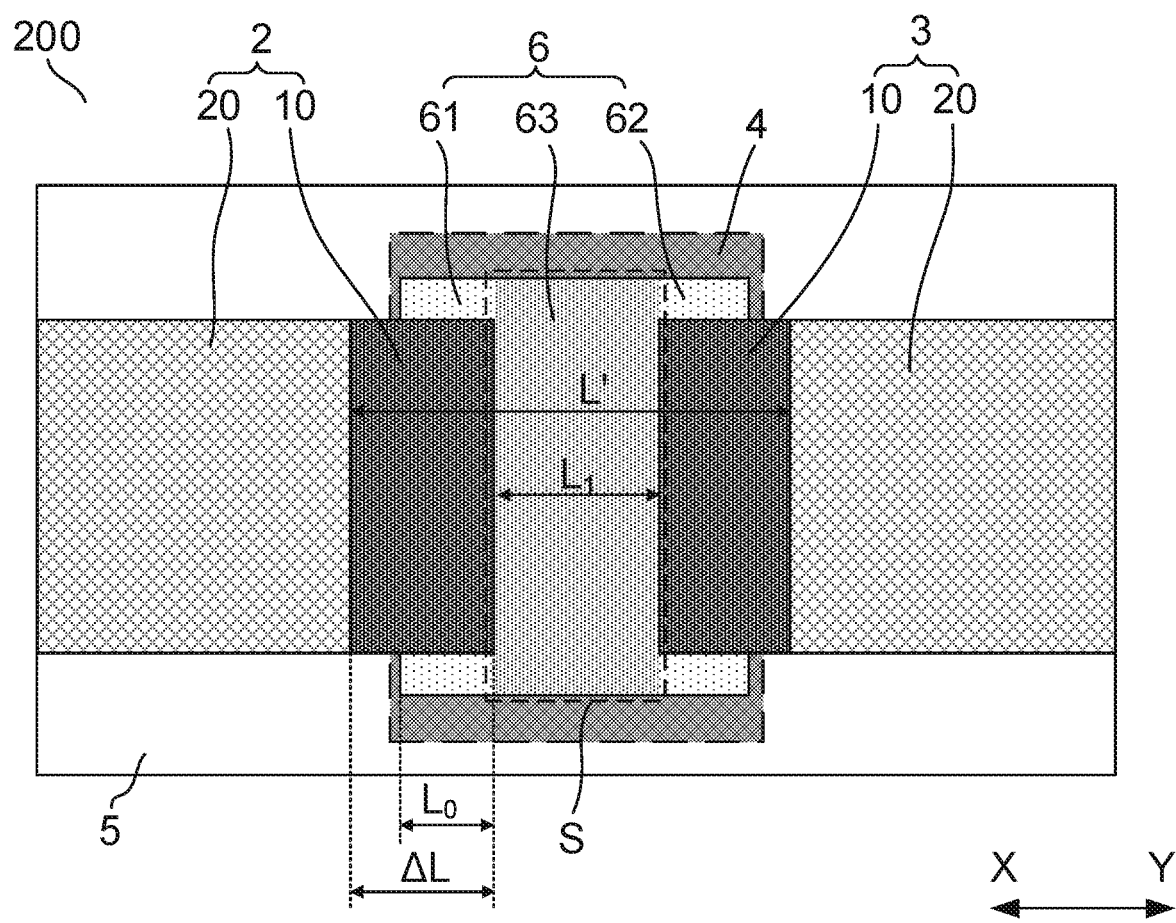
FIG. 7 is a schematic plan view showing a structure of yet another thin film transistor according to some embodiments of the present disclosure.

Herein, the area of the overlapping region between the orthographic projection of the second sub-electrode 20 of the at least one of the source 2 and the drain 3 on the substrate 1 and the orthographic projection of the active layer 6 on the substrate 1 includes: a case in which the area is zero, that is, the orthographic projection of the second sub-electrode 20 of the at least one of the source 2 and the drain 3 on the substrate 1 and the orthographic projection of the active layer 6 on the substrate 1 do not overlap, as shown in FIG. 7; and a case in which the area is not zero, that is, the orthographic projection of the second sub-electrode 20 of the at least one of the source 2 and the drain 3 on the substrate 1 and the orthographic projection of the active layer 6 on the substrate 1 overlap, as shown in FIG. 2.

In addition, that "an area of the overlapping region between an orthographic projection of the second sub-electrode 20 of the at least one of the source 2 and the drain 3 on the substrate 1 and an orthographic projection of the active layer 6 on the substrate 1 is less than an area of an overlapping region between an orthographic projection of the first sub-electrode 10 of the at least one of the source 2 and the drain 3 on the substrate 1 and the orthographic projection of the active layer 6 on the substrate 1" includes the following three cases.

First, an area of the orthographic projection of the second sub-electrode 20 in an overlapping region between orthographic projections of the drain 3 and the active layer 6 is less than an area of the orthographic projection of the first sub-electrode 10 in the overlapping region between the orthographic projections of the drain 3 and the active layer 6, as shown in FIG. 3a.

Second, an area of the orthographic projection of the second sub-electrode 20 in an overlapping region between orthographic projections of the source 2 and the active layer 6 is less than an area of the first sub-electrode 10 in the overlapping region between the orthographic projections of the source 2 and the active layer 6.

Figure 5:
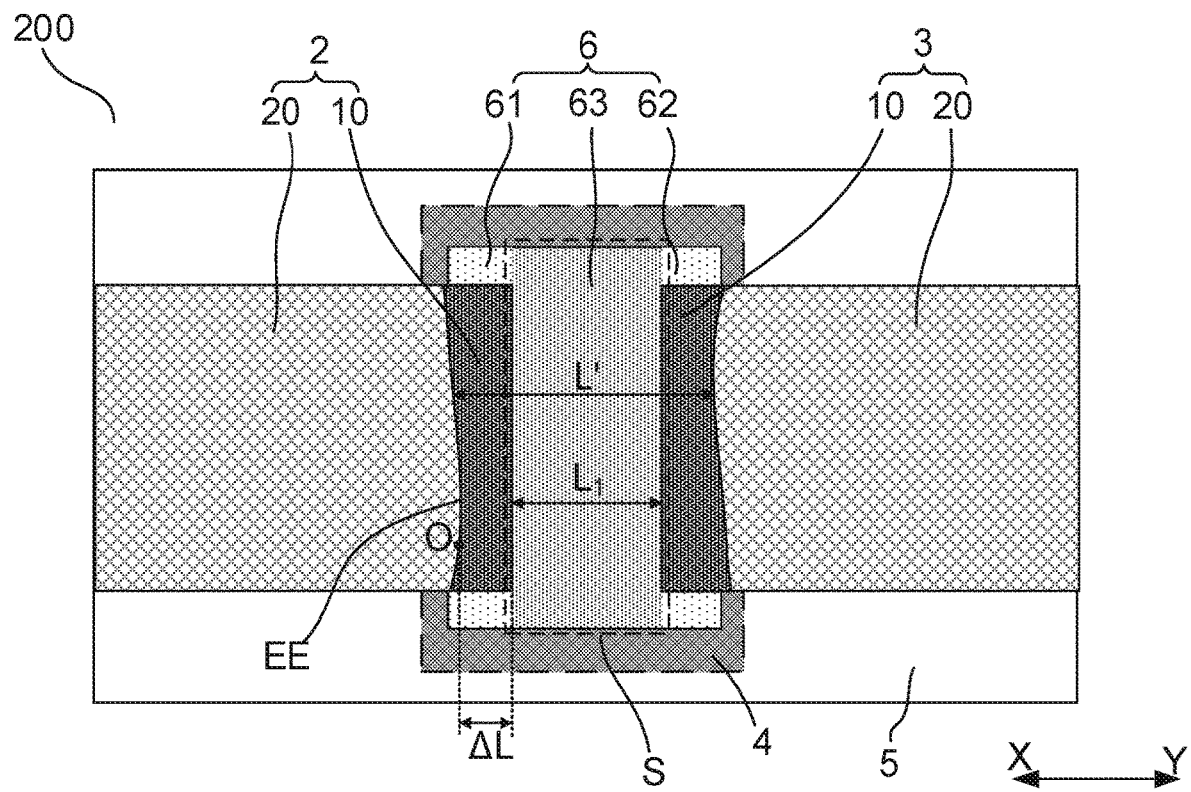
FIG. 5 is a schematic plan view showing a structure of another thin film transistor according to some embodiments of the present disclosure.

Third, as shown in FIG. 5, an area of the orthographic projection of the second sub-electrode 20 in an overlapping region between orthographic projections of the drain 3 and the active layer 6 is less than an area of the orthographic projection of the first sub-electrode 10 in the overlapping region between the orthographic projections of the drain 3 and the active layer 6. In addition, an area of the orthographic projection of the second sub-electrode 20 in an overlapping region between orthographic projections of the source 2 and the active layer 6 is less than an area of an orthographic projection of the first sub-electrode 10 in the overlapping region between the orthographic projections of the source 2 and the active layer 6.

In the foregoing embodiments, the area of the second sub-electrode 20 in the overlapping region between the orthographic projection of the at least one of the source 2 and the drain 3 on the substrate 1 and the orthographic projection of the active layer 6 on the substrate 1 is less than the area of the first sub-electrode 10 in the overlapping region. As a result, a contact area between the second sub-electrode 20 and the first sub-electrode 10 is relatively small, which reduces a quantity of metal atoms of the second sub-electrode 20 diffusing into the first sub-electrode 10, so that a probability that the metal atoms of the second sub-electrode 20 diffuse into the channel region S of the thin film transistor 200 after passing through the first sub-electrode 10 is decreased, and reliability of the thin film transistor 200 is increased.

Herein, that "each of the source 2 and the drain 3 includes a first sub-electrode 10 and a second sub-electrode 20 that are stacked" means that each of the source 2 and the drain 3 at least includes the first sub-electrode 10 and the second sub-electrode 20 that are stacked. In some embodiments, referring to FIGS. 3a to 3c, each of the source 2 and the drain 3 includes only the first sub-electrode 10 and the second sub-electrode 20. In some other embodiments, in addition to the first sub-electrode 10 and the second sub-electrode 20, each of the source 2 and the drain 3 includes other sub-electrodes (such as a third sub-electrode), which is not specifically limited in the present disclosure.

As for the case in which each of the source 2 and the drain 3 includes more than two sub-electrodes, the first sub-electrode 10 and the second sub-electrode 20 that are stacked may be two adjacent sub-electrodes or two non-adjacent sub-electrodes. For example, other sub-electrode(s) are provided between the first sub-electrode 10 and the second sub-electrode 20, which is not limited herein.

In some embodiments, the first sub-electrode 10 in the source 2 and the first sub-electrode 10 in the drain 3 are formed through a same patterning process, and the second sub-electrode 20 in the source 2 and the second sub-electrode 20 in the drain 3 are formed through another same patterning process, which may simplify steps in the process.

The type of the thin film transistor 200 is not specifically limited herein. For example, as shown in FIGS. 2 and 3a, the thin film transistor 200 is a bottom-gate thin film transistor, and includes a gate 4, a gate insulating layer 5, the active layer 6 and a source and drain pattern layer (including the source 2 and the drain 3) that are sequentially arranged on the substrate 1. It will be noted that, in order to show the gate 4 in FIG. 2, the gate insulating layer 5 is shown in a transparent form, and a contour of the gate 4 is shown by a dashed line. In addition, the gate 4 and the gate insulating layer 5 in FIGS. 5, 6, 7, 8, and 10 are also processed in a same manner during drawing.

Figure 3B:
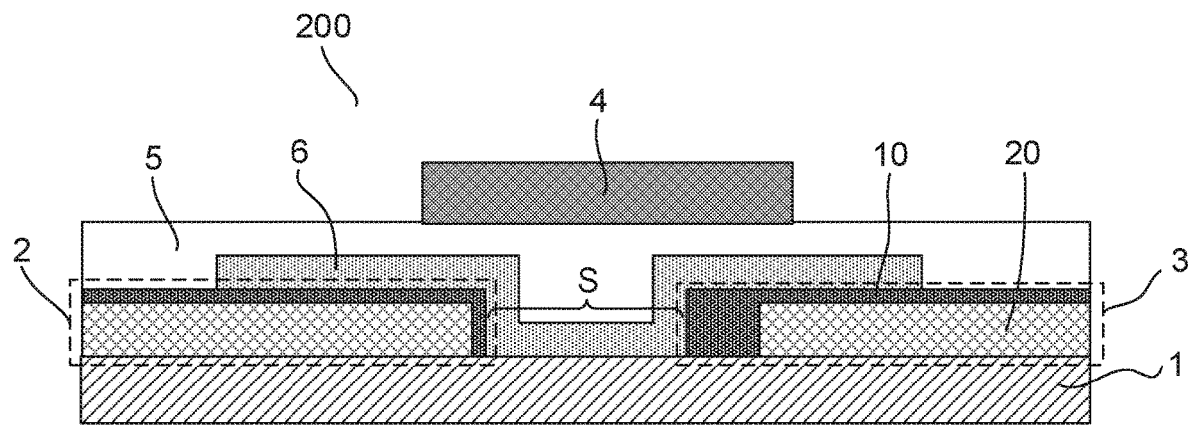
FIG. 3b is a schematic cross-sectional view showing a structure of a thin film transistor according to some embodiments of the present disclosure.
Figure 3C:
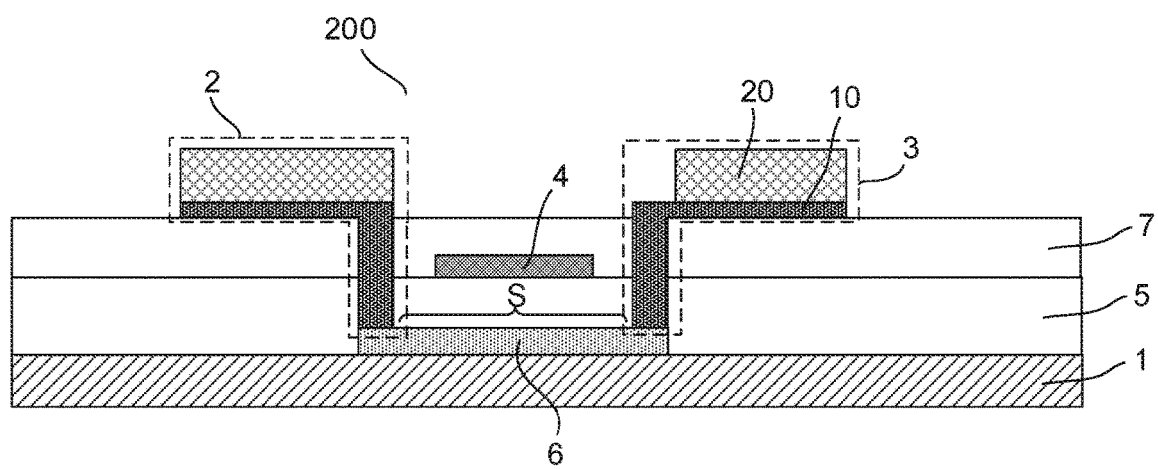
FIG. 3c is a schematic cross-sectional view showing a structure of another thin film transistor according to some embodiments of the present disclosure.

For another example, the thin film transistor 200 is a top-gate thin film transistor. For example, as shown in FIG. 3b, the thin film transistor 200 includes a source and drain pattern layer (including the source 2 and the drain 3), the active layer 6, a gate insulating layer 5 and a gate 4 that are sequentially arranged on the substrate 1. For another example, as shown in FIG. 3c, the thin film transistor 200 includes the active layer 6, a gate insulating layer 5, a gate 4, an interlayer insulating layer 7 and a source and drain pattern layer (including the source 2 and the drain 3) that are sequentially arranged on the substrate 1. The source and drain pattern layer is electrically connected to the active layer 6 through via holes provided in the gate insulating layer 5 and the interlayer insulating layer 7.

The thin film transistor 200 may also be other types of top-gate thin film transistor or bottom-gate thin film transistor, which will not be listed herein one by one.

The bottom-gate thin film transistor 200 and the top-gate thin film transistor 200 are respectively exemplarily described below by taking an example in which the area of the overlapping region between the orthographic projection of the second sub-electrode 20 of the drain 3 on the substrate 1 and the orthographic projection of the active layer 6 on the substrate 1 is less than the area of the overlapping region between the orthographic projection of the first sub-electrode 10 of the drain 3 on the substrate 1 and the orthographic projection of the active layer 6 on the substrate 1.

Figure 4A:
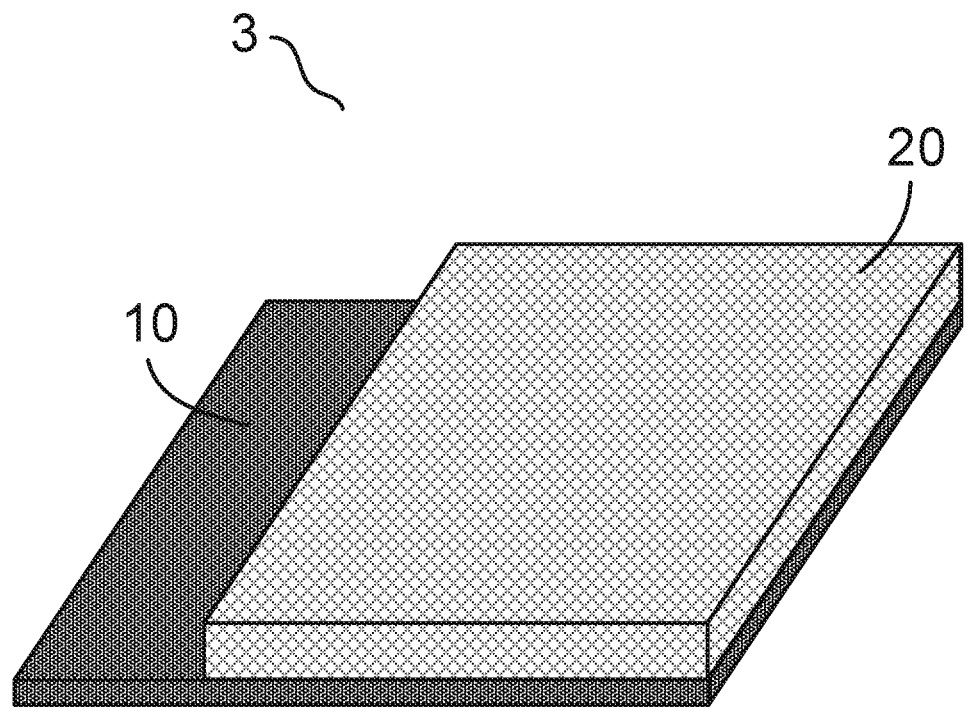
FIG. 4a is a schematic diagram showing a structure of layers of a drain of a thin film transistor according to some embodiments of the present disclosure.

As an example, as shown in FIGS. 3a and 4a, the thin film transistor 200 is the bottom-gate thin film transistor, and the first sub-electrode 10 is exposed because the first sub-electrode 10 is not covered by a material of the second sub-electrode 20 thereon.

Figure 4B:
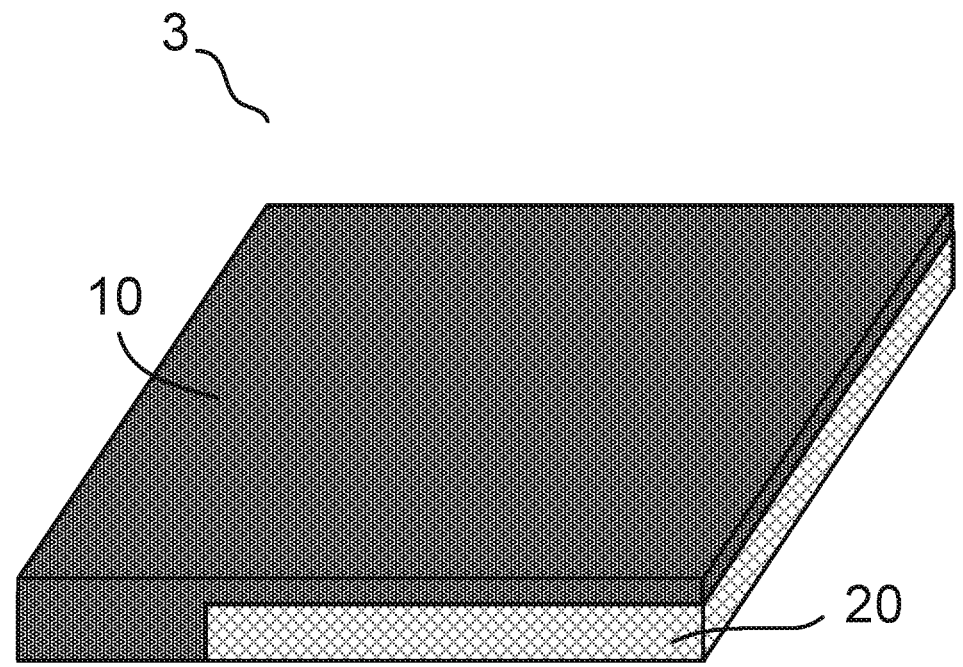
FIG. 4b is a schematic diagram showing a structure of layers of a drain of another thin film transistor according to some embodiments of the present disclosure.

As another example, as shown in FIGS. 3b and 4b, the thin film transistor 200 is the top-gate thin film transistor shown in FIG. 3b, and the source 2 and the drain 3 are located between the active layer 6 and the substrate 1. In this case, a gap between the second sub-electrode 20 and the active layer 6 is filled with a material of the first sub-electrode 10 disposed on the second sub-electrode 20.

As another example, as shown in FIGS. 3c and 4a, the thin film transistor 200 is the top-gate thin film transistor shown in FIG. 3c, and the source 2 and the drain 3 are located on a side of the active layer 6 away from the substrate 1. In this case, the first sub-electrode 10 is exposed because the first sub-electrode 10 is not covered by a material of the second sub-electrode 20 thereon.

The cases in which the area of the overlapping region between the orthographic projection of the second sub-electrode 20 of the source 2 on the substrate 1 and the orthographic projection of the active layer 6 on the substrate 1 is less than that between the orthographic projection of the first sub-electrode 10 of the source 2 on the substrate 1 and the orthographic projection of the active layer 6 on the substrate 1, and the area of the overlapping region between the orthographic projection of the second sub-electrode 20 of each of the source 2 and the drain 3 on the substrate 1 and the orthographic projection of the active layer 6 on the substrate 1 is less than that between the orthographic projection of the first sub-electrode 10 of the each of the source 2 and the drain 3 on the substrate 1 and the orthographic projection of the active layer 6 on the substrate 1 are similar to the foregoing solution. Details will not be repeated here again.

In addition, the thin film transistor 200 may be the thin film transistor shown in FIG. 3a, 3b, or 3c, the source 2 and the drain 3 of which are roughly symmetrical, or an asymmetrical thin film transistor with a U-shaped channel region (a source and a drain of the transistor are mutually asymmetrical), which is not limited in the present disclosure.

In some embodiments, as shown in FIG. 3a, the thin film transistor 200 includes a gate 4, a gate insulation layer 5, the active layer 6 and a source and drain pattern layer that are sequentially arranged on the substrate 1 along a direction away from the substrate 1. The source and drain pattern layer includes the source 2 and the drain 3.

It will be noted that the gate 4, the gate insulation layer 5, the active layer 6 and the source and drain pattern layer in the thin film transistor 200 may be arranged in some other sequences. For example, as shown in FIG. 3b, the source and drain pattern layer, the active layer 6, the gate insulation layer 5 and the gate 4 are sequentially arranged on the substrate 1 along the direction away from the substrate 1. For another example, as shown in FIG. 3c, the active layer 6, the gate insulation layer 5, the gate 4, the interlayer insulating layer 7 and the source and drain pattern layer are sequentially arranged on the substrate 1 along the direction away from the substrate 1.

Herein, positional relationships between the source and drain pattern layer and the active layer 6 and between the source and drain pattern layer and the substrate 1 are not specifically limited, and may be selected and set according to actual needs. For example, as shown in FIG. 3a, the source and drain pattern layer is located on a side of the active layer 6 away from the substrate 1. In this case, the second sub-electrode 20 is in a high position, and the first sub-electrode 10 is in a low position (that is, the first sub-electrode 10 is closer to the substrate 1 relative to the second sub-electrode 20). For another example, as shown in FIG. 3b, the source and drain pattern layer is located on a side of the active layer 6 proximate to the substrate 1. In this case, the first sub-electrode 10 is in a high position, and the second sub-electrode 20 is in a low position (that is, the second sub-electrode 20 is closer to the substrate 1 relative to the first sub-electrode 10).

In some embodiments, a material of the second sub-electrode 20 includes at least one of metal materials such as copper, aluminum and silver. These metal materials have relatively high conductivity, so that resistance of the source 2 and/or the drain 3 may be reduced.

In some embodiments, a material of the first sub-electrode 10 includes at least one of metal materials such as molybdenum and titanium. These metal materials have a relatively good effect of bonding with the active layer 6, so that a probability of poor contact between the source 2 and the active layer 6 and/or between the drain 3 and the active layer 6 may be reduced. In addition, the first sub-electrode 10 further blocks diffusion of the metal atoms of the second sub-electrode 20 to an extent.

A material of the active layer 6 is not specifically limited herein, and may be selected according to actual needs. For example, the active layer 6 is made of a metallic oxide such as an indium gallium zinc oxide (IGZO).

In some embodiments, as shown in FIG. 5, the active layer 6 includes a first contact portion 61 in electrical contact with the first sub-electrode 10 of the source 2, a second contact portion 62 in electrical contact with the first sub-electrode 10 of the drain 3 and a non-contact portion 63 located between the first contact portion 61 and the second contact portion 62.

A distance L', in a first direction XY, between an edge of the second sub-electrode 20 of the source 2 proximate to the non-contact portion 63 and each of at least some regions on an edge of the second sub-electrode 20 of the drain 3 proximate to the non-contact portion 63 is greater than a length $L_1$ of the non-contact portion 63 in the first direction XY. The first direction XY is a direction parallel to the substrate 1 and pointing to the second contact portion 62 from the first contact portion 61. Herein, paralleling to the substrate 1 refers to paralleling to a surface of the substrate 1 facing the thin film transistor 200.

In the thin film transistor 200, the non-contact portion 63 and the channel region S in the active layer 6 almost completely overlaps, thereby ensuring that the distance L' is greater than the length $L_1$ in at least some regions, which may at least partially increase a distance from the edge of the second sub-electrode 20 proximate to the non-contact portion 63 to the channel region S, so as to further reduce the probability that the metal atoms of the second sub-electrode 20 diffuse into the channel region S in the active layer 6.

On this basis, referring to FIG. 5 again, in some embodiments, a distance ΔL from any position on the edge, which is proximate to the non-contact portion 63, of the second sub-electrode 20 of the at least one of the source 2 and the drain 3 to the non-contact portion 63 is greater than zero.

Herein, the above-described "distance ΔL" refers to a distance, in the first direction XY, from the edge (such as edge EE in FIG. 5) of the second sub-electrode 20 proximate to the non-contact portion 63 to the non-contact portion 63. For example, in FIG. 5, a distance from a point O on the edge EE of the second sub-electrode 20 in the source 2 proximate to the non-contact portion 63 to the non-contact portion 63 is ΔL.

In this way, the distance from the edge of the second sub-electrode 20 proximate to the channel region S to the channel region S is increased, and the probability that the metal atoms of the second sub-electrode 20 diffuse into the channel region S of the active layer 6 is further reduced.

For example, the distance ΔL from any position on the edge, which is proximate to the non-contact portion 63, of the second sub-electrode 20 of the at least one of the source 2 and the drain 3 to the edge of the non-contact portion 63 has a range of 2 μm to 7 μm. For example, the distance ΔL has a range of 3 μm to 6 μm.

In a case where the foregoing distance ΔL is greater than or equal to 2 μm, a quantity of the metal atoms in the second sub-electrode diffusing into the channel region S may be effectively reduced. Therefore, in some embodiments, the distance ΔL is set to be greater than or equal to 2 μm.

In addition, in a case where the foregoing distance ΔL is less than or equal to 7 μm, the second sub-electrode 20 will not be removed excessively, which ensures that the partial removal of the second sub-electrode 20 will not cause negative effects to the thin film transistor 200.

Herein, a value of the distance ΔL may be set according to actual needs. For example, the foregoing distance ΔL may be set to 2 μm, 3 μm, 4 μm, 5 μm, 6 μm or 7 μm according to the actual needs.

Figure 6:
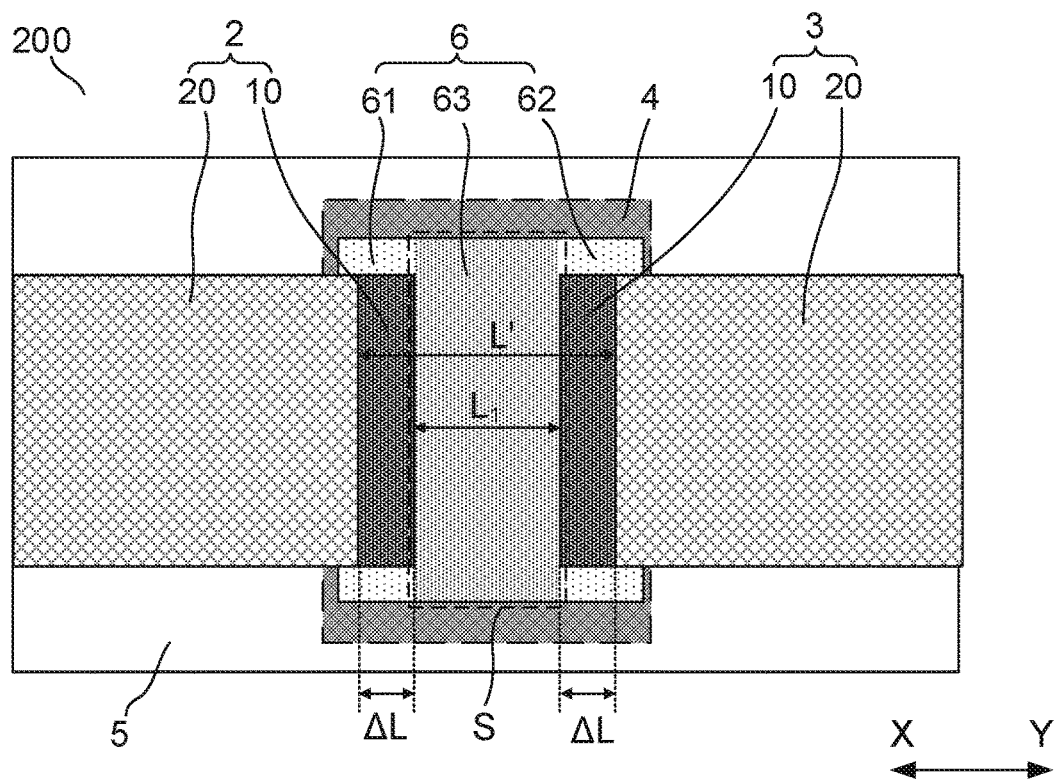
FIG. 6 is a schematic plan view showing a structure of yet another thin film transistor according to some embodiments of the present disclosure.

In some embodiments, referring to FIG. 6, the distance ΔL from the edge, which is proximate to the non-contact portion 63, of the second sub-electrode 20 of each of the source 2 and the drain 3 to the non-contact portion 63 is greater than zero, so as to ensure that there is a certain distance from the edge, which is proximate to the non-contact portion 63, of the second sub-electrode 20 of each of the source 2 and the drain 3 to the non-contact portion 63, i.e., to ensure that the channel region S in the active layer 6 has certain distances from the edges of the second sub-electrodes 20 respectively proximate to two sides of the channel region S.

It will be noted that, in cases where a distance between two is described, the distance refers to a distance along the first direction XY between the two.

In some embodiments, as shown in FIG. 6, a distance ΔL from any position on the edge, which is proximate to the non-contact portion 63, of the second sub-electrode 20 of the at least one of the source 2 and the drain 3 to the non-contact portion 63 is equal.

In this case, the edge, which is proximate to the non-contact portion 63, of the second sub-electrode 20 of the at least one of the source 2 and the drain 3 is parallel to an edge of the non-contact portion 63 on a corresponding side.

For ease of description, the distance from the edge of the second sub-electrode 20 of the source 2 proximate to the non-contact portion 63 to the non-contact portion 63 is referred to as $\Delta L_1$, and the distance from the edge of the second sub-electrode 20 of the drain 3 proximate to the non-contact portion 63 to the non-contact portion 63 is referred to as $\Delta L_2$.

For example, in a case where the distance from any position on the edge of the second sub-electrode 20 of the source 2 proximate to the non-contact portion 63 is equal and the distance from any position on the edge of the second sub-electrode 20 of the drain 3 proximate to the non-contact portion 63 to the non-contact portion 63 is equal, the distance $\Delta L_1$ from the edge of the second sub-electrode 20 of the source 2 proximate to the non-contact portion 63 to the non-contact portion 63 is equal to the distance $\Delta L_2$ from the edge of the second sub-electrode 20 of the drain 3 proximate to the non-contact portion 63 to the non-contact portion 63, that is, $\Delta L_2 = \Delta L_2$.

Figure 11:
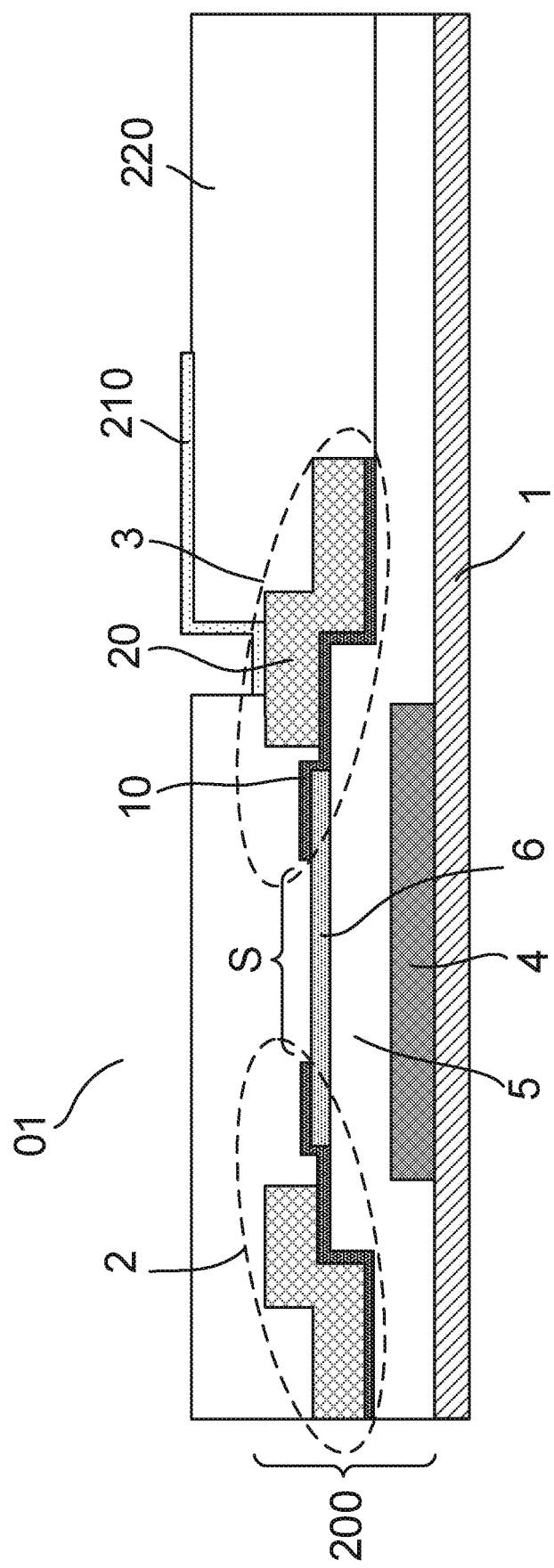
FIG. 11 is a schematic cross-sectional view showing a structure of an array substrate according to some embodiments of the present disclosure.

In some embodiments, referring to FIGS. 7 and 11, the distance ΔL from the edge, which is proximate to the non-contact portion 63, of the second sub-electrode 20 of the at least one of the source 2 and the drain 3 to the non-contact portion 63 is greater than or equal to a length $L_0$ of a corresponding contact portion in the first direction XY. That "a corresponding contact portion" is a contact portion closest to the second sub-electrode 20. For example, the contact portion corresponding to the second sub-electrode 20 of the source 2 is the contact portion 61. For another example, the contact portion corresponding to the second sub-electrode 20 of the drain 3 is the contact portion 62.

In this way, it may be ensured that there is no overlapping region between the orthographic projection of the second sub-electrode 20 and the orthographic projection of the non-contact portion 63 of the active layer 6, and that the channel region S of the active layer 6 is not covered by the second sub-electrode 20, so as to further reduce the probability that the metal atoms of the second sub-electrode 20 diffuse into the channel region S.

Figure 8:
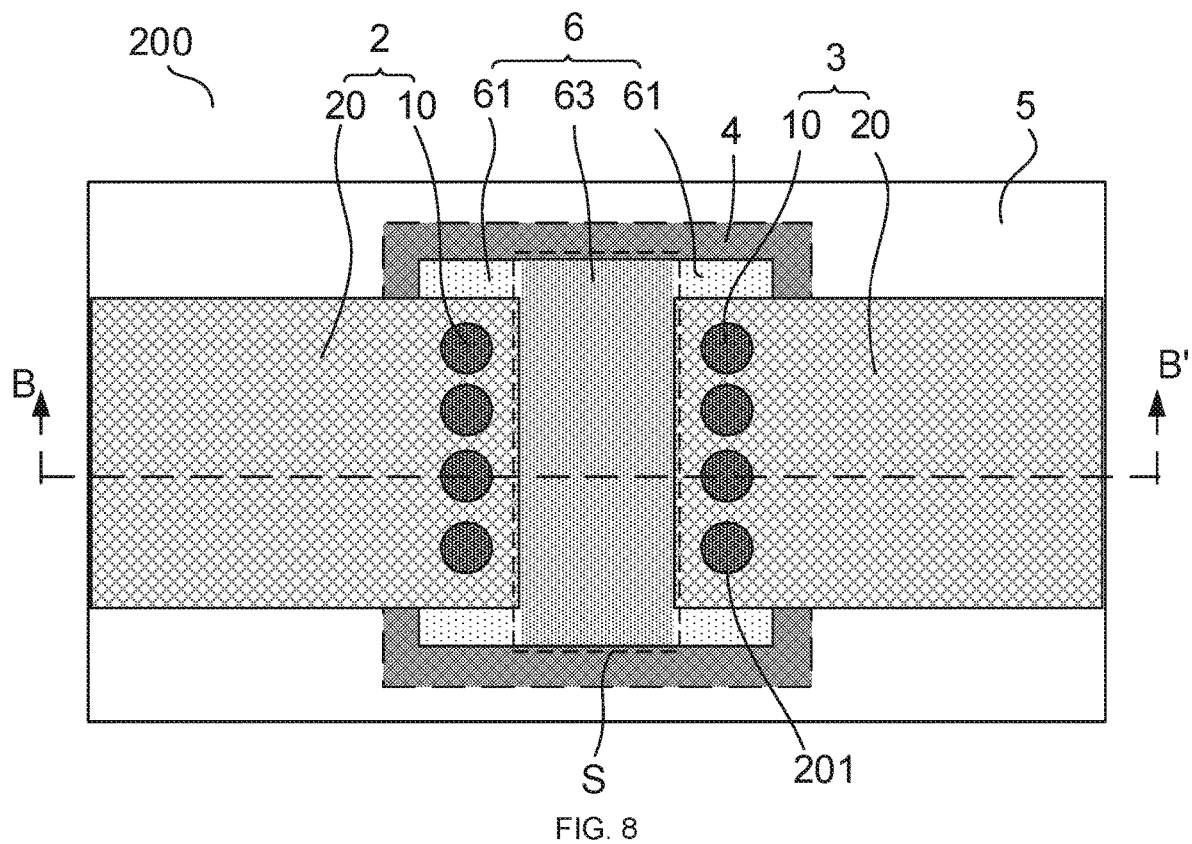
FIG. 8 is a schematic plan view showing a structure of yet another thin film transistor according to some embodiments of the present disclosure.
Figure 9:
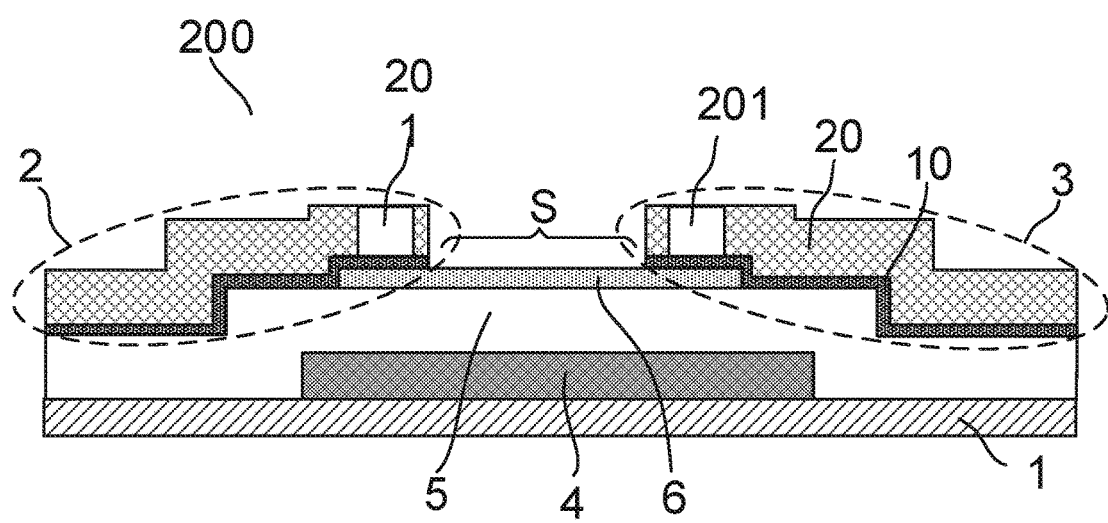
FIG. 9 is a schematic cross-sectional view showing a structure of the thin film transistor shown in FIG. 8 taken along dashed line BB'.

In some embodiments, referring to FIGS. 8 and 9, the second sub-electrode 20 of the at least one of the source 2 and the drain 3 has at least one hollow-out region 201, and an orthographic projection of the at least one hollow-out region 201 on the substrate 1 is located within a range of the orthographic projection of the active layer 6 on the substrate 1. In other words, the hollow-out region 201 corresponds to a region in which the contact portion 61 or the contact portion 62 of the active layer 6 is located.

It will be noted that a material of the second sub-electrode 20 located in the hollow-out region 201 is removed. Referring to FIGS. 8 and 9, the thin film transistor 200 being the bottom-gate thin film transistor is taken as an example, and a portion of the first sub-electrode 10 corresponding to the hollowed-out portion 201 is exposed because the material of the second sub-electrode 20 disposed on the portion of the first sub-electrode 10 is removed.

Herein, that "the second sub-electrode 20 of the at least one of the source 2 and the drain 3 has at least one hollow-out region 201" includes the second sub-electrode 20 of the source 2 having at least one hollow-out region 201, the second sub-electrode 20 of the drain 3 having at least one hollow-out region 201, and each of the source 2 and the drain 3 having at least one hollow-out region 201.

In this way, portions of the second sub-electrode(s) 20 in the overlapping regions between the orthographic projections of the second sub-electrode(s) 20 and the orthographic projection of the active layer 6 are removed, thereby reducing the probability that the metal atoms of the second sub-electrodes 20 diffuse into the channel region S of active layer 6.

Herein, both a size and a shape of the at least one hollow-out region 201 are not specifically limited. For example, referring to FIG. 8, the second sub-electrode 20 has circular hollow-out regions 201. As another example, referring to FIG. 10, the hollow-out region 201 is in a shape of a semicircle. The hollow-out region 201 may also be in a shape of a rectangle, an oval or the like.

In addition, the number of the at least one hollow-out region 201 is not specifically limited as well. The number of hollow-out region(s) 201 may be one or more, which may be set according to an actual need. For example, referring to FIGS. 8 and 9, each of the source 2 and the drain 3 has four hollow-out regions 201.

Figure 10:
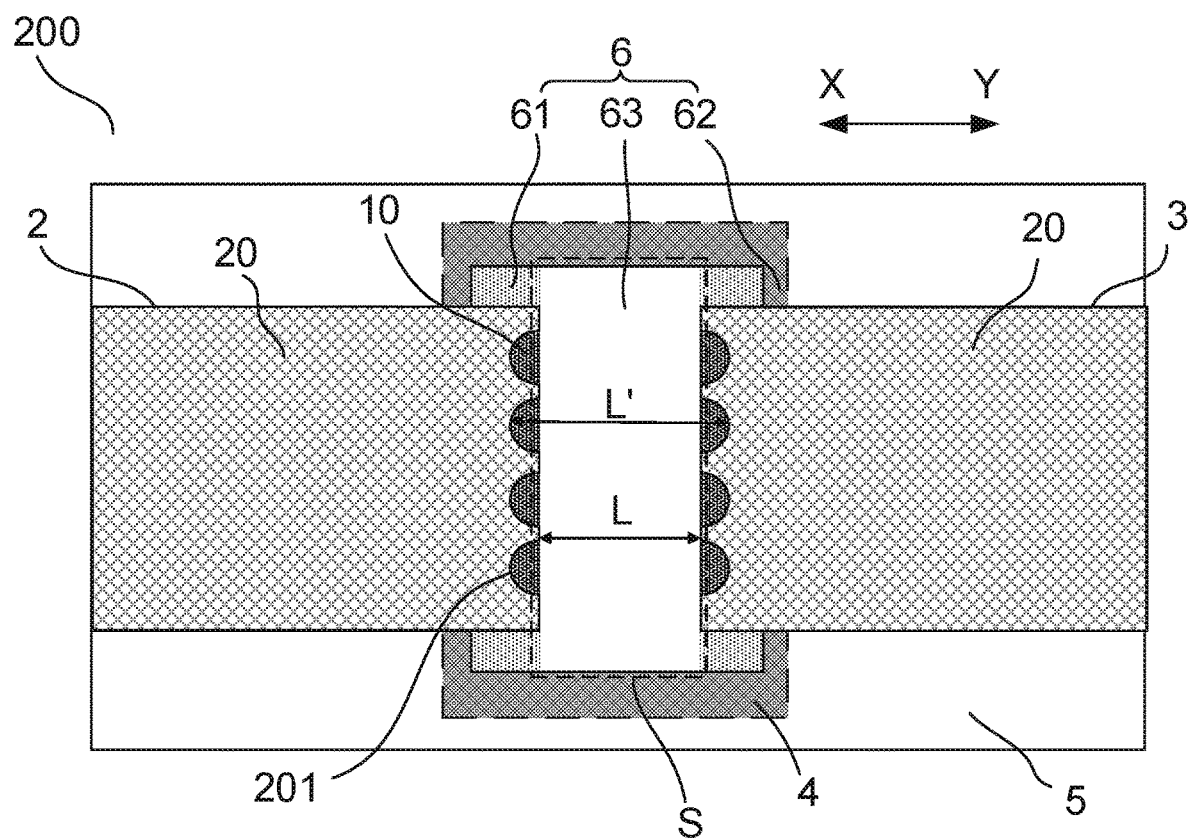
FIG. 10 is a schematic plan view showing a structure of yet another thin film transistor according to some embodiments of the present disclosure.

In some embodiments, referring to FIG. 10, the second sub-electrode 20 of each of the source 2 and the drain 3 has at least one hollow-out region 201. In this case, the second sub-electrodes 20 at two sides of the channel region S of the active layer 6 that are respectively proximate to the source 2 and the drain 3 are both partially removed, thereby further reducing the probability that the metal atoms of the second sub-electrodes 20 diffuse into the channel region of the active layer 6.

In some embodiments, referring to FIG. 10 again, the hollow-out regions 201 are located on an edge of the source 2 proximate to the non-contact portion 63 of the active layer 6 and/or on an edge of the drain 3 proximate to the non-contact portion 63 of the active layer 6. In this way, the hollow-out regions 201 are respectively disposed on the edges of the second sub-electrode(s) 20 of the source 2 and/or the drain 3 proximate to the non-contact portion 63, that is, the portions of the second sub-electrode(s) 20 of the source 2 and/or the drain 3 on their edges proximate to the non-contact portion 63 are removed, which at least partially increases the distances respectively from the edges of the second sub-electrodes 20 proximate to the non-contact portion 63 to the non-contact portion 63, so as to further reduce the probability that the metal atoms of the second sub-electrodes 20 diffuse into the channel region S of the active layer 6.

Some embodiments of the present disclosure further provide an array substrate 01. Referring to FIG. 11, the array substrate 01 includes the thin film transistor 200 in any one of the foregoing embodiments. The array substrate 01 has a structure that is the same as the thin film transistor 200, and a probability that the metal atoms of the second sub-electrodes 20 diffuse into the channel region S of the thin film transistor 200 after passing through the first sub-electrodes 10 is decreased as well. A structure and beneficial effects of the thin film transistor 200 have been described in the foregoing embodiments in detail. Therefore, details will not be repeated here again.

For example, as shown in FIG. 11, the array substrate 01 further includes pixel electrodes 210 and a passivation layer 220. The passivation layer 220 and the pixel electrodes 210 are sequentially stacked on a side of the source 2 and the drain 3 of the thin film transistor 200 away from the substrate 1. Via holes are provided in portions of the passivation layer 220 corresponding to drains 3, and a pixel electrode 210 is electrically connected to a drain 3 through a via hole, so as to implement an electrical connection between the thin film transistor 200 and the pixel electrode 210. Herein, the pixel electrode 210 may be made of conductive materials such as indium tin oxide (ITO).

Figure 12:
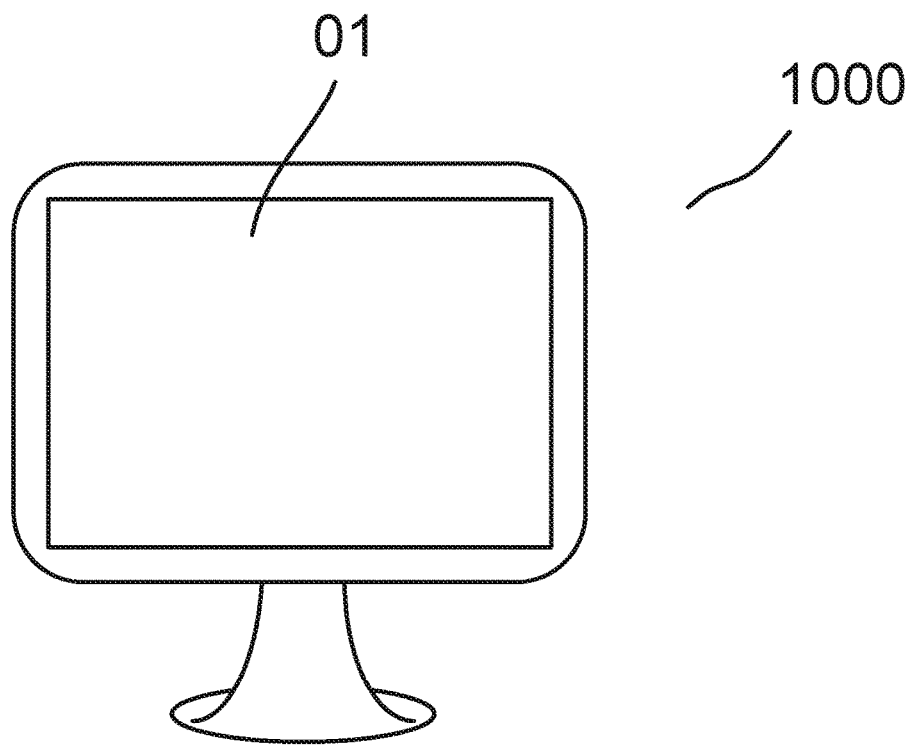
FIG. 12 is a schematic diagram showing a structure of a display device according to some embodiments of the present disclosure.

Some embodiments of the present disclosure further provide a display device 1000. Referring to FIG. 12, the display device 1000 includes the array substrate 01 described in the foregoing embodiment. The display device 1000 has a structure that is the same as the array substrate 01 provided in the foregoing embodiments, and a probability that the metal atoms of the second sub-electrodes 20 diffuse into the channel region S of the thin film transistor 200 after passing through the first sub-electrode 10 is decreased. The structure and beneficial effects of the thin film transistor have been described in the foregoing embodiments in detail. Therefore, details will not be repeated here again.

It will be noted that, in the embodiments of the present disclosure, the display device 1000 includes at least a liquid crystal display panel, and the display panel includes the above-described array substrate 01. For example, the display panel may be a liquid crystal (abbreviated as LC) display panel, an organic light-emitting diode (abbreviated as OLED) display panel, a micro light-emitting diode (abbreviated as Micro LED) display panel, a mini light-emitting diode (abbreviated as Mini LED) display panel or a quantum dot light-emitting diode (abbreviated as QLED) display panel. The display device 1000 may be applied to any product or component with a display function, such as a liquid crystal display, a liquid crystal television, a digital photo frame, a mobile phone or a tablet computer.

Figure 13:
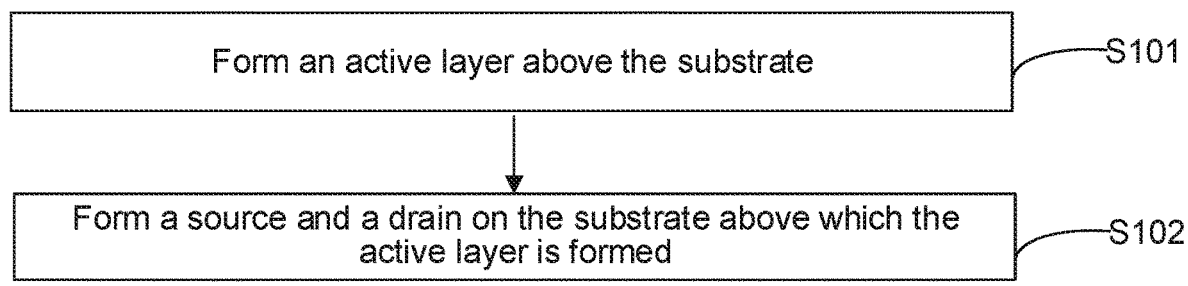
FIG. 13 is a flowchart of a method for manufacturing a thin film transistor according to some embodiments of the present disclosure.

Some embodiments of the present disclosure further provide a method for manufacturing a thin film transistor. Referring to FIGS. 3a and 13, the method for manufacturing the thin film transistor includes the following steps.

In S101, an active layer 6 is formed above the substrate 1.

In S102, a source 2 and a drain 3 are formed on the substrate 1 above which the active layer 6 has been formed.

The source 2 and the drain 3 are separately in electrical contact with the active layer 6. Each of the source 2 and the drain 3 includes a first sub-electrode 10 and a second sub-electrode 20 that are stacked, and the second sub-electrode 20 is closer to the active layer 6 relative to the first sub-electrode 10. An area of an overlapping region between an orthographic projection of the second sub-electrode 20 of at least one of the source 2 and the drain 3 on the substrate 1 and an orthographic projection of the active layer 6 on the substrate 1 is less than an area of the overlapping region between an orthographic projection of the first sub-electrode 10 of the at least one of the source 2 and the drain 3 on the substrate 1 and the orthographic projection of the active layer 6 on the substrate 1.

In this way, the area of the second sub-electrode 20 in the overlapping region between the orthographic projection of the at least one of the source 2 and the drain 3 and the orthographic projection of the active layer 6 on the substrate 1 is smaller than the area of a corresponding first sub-electrode 10 in the overlapping region. Therefore, a contact area between the second sub-electrode 20 and the first sub-electrode 10 is relatively small, which reduces a quantity of metal atoms of the second sub-electrode 20 diffusing into the first sub-electrode 10, so that a probability that the metal atoms of the second sub-electrode 20 diffuse into the channel region S of the thin film transistor 200 after passing through the first sub-electrode 10 is decreased, and reliability of the thin film transistor 200 is improved.

For example, in the S101, the active layer 6 is formed above the substrate 1 by using an IGZO material through a fifth patterning process.

It will be noted that, patterning processes in the present disclosure may include a photoetching process, or include a photoetching process and etching steps, and may further include other processes used for forming a predetermined pattern such as printing or inkjet. The photoetching process refers to a process of forming a pattern through processes such as film formation, exposure and development using a photoresist, a mask, an exposure machine and the like. A corresponding patterning process may be selected in the embodiments of the present disclosure according to a structure of the thin film transistor 200 that actually needs to be formed.

In addition, the foregoing substrate 1 is not necessarily a substrate made of a single material, for example, a glass substrate or a polyimide (PI) substrate, and the substrate 1 may be a substrate or device on which other film layer(s) have been formed, which are not specifically limited in the present disclosure.

Figure 14:
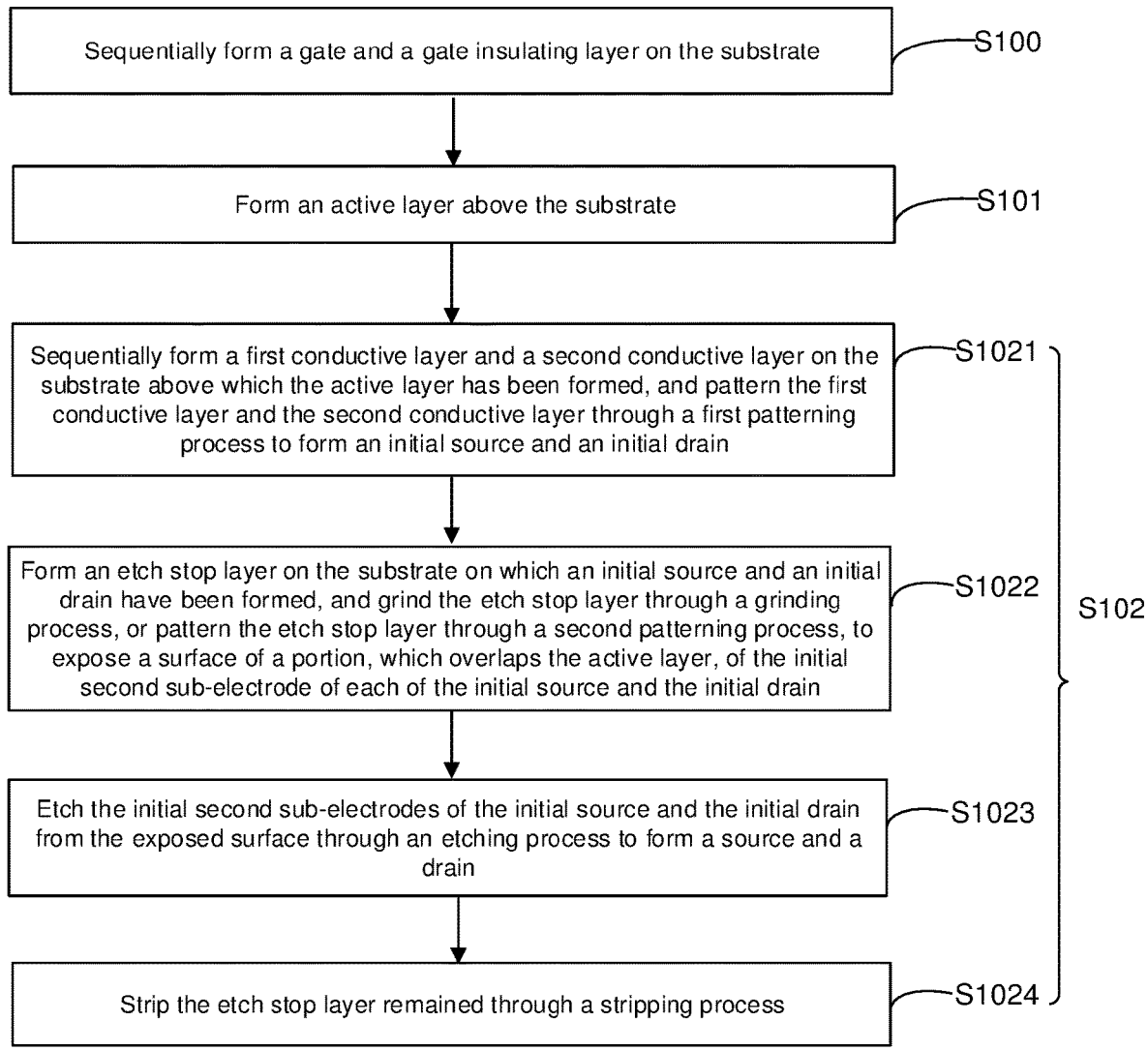
FIG. 14 is a flowchart of another method for manufacturing a thin film transistor according to some embodiments of the present disclosure.

In some embodiments, as for the thin film transistor 200 shown in FIG. 3a, referring to FIG. 14, the method for manufacturing the thin film transistor further includes the following step before S101.

In S100, a gate 4 and a gate insulating layer 5 are sequentially formed on the substrate 1.

It will be noted that, in this case, S101 is that the active layer 6 is formed on the substrate 1 on which the gate 4 and the gate insulating layer 5 have been formed.

Figure 15:
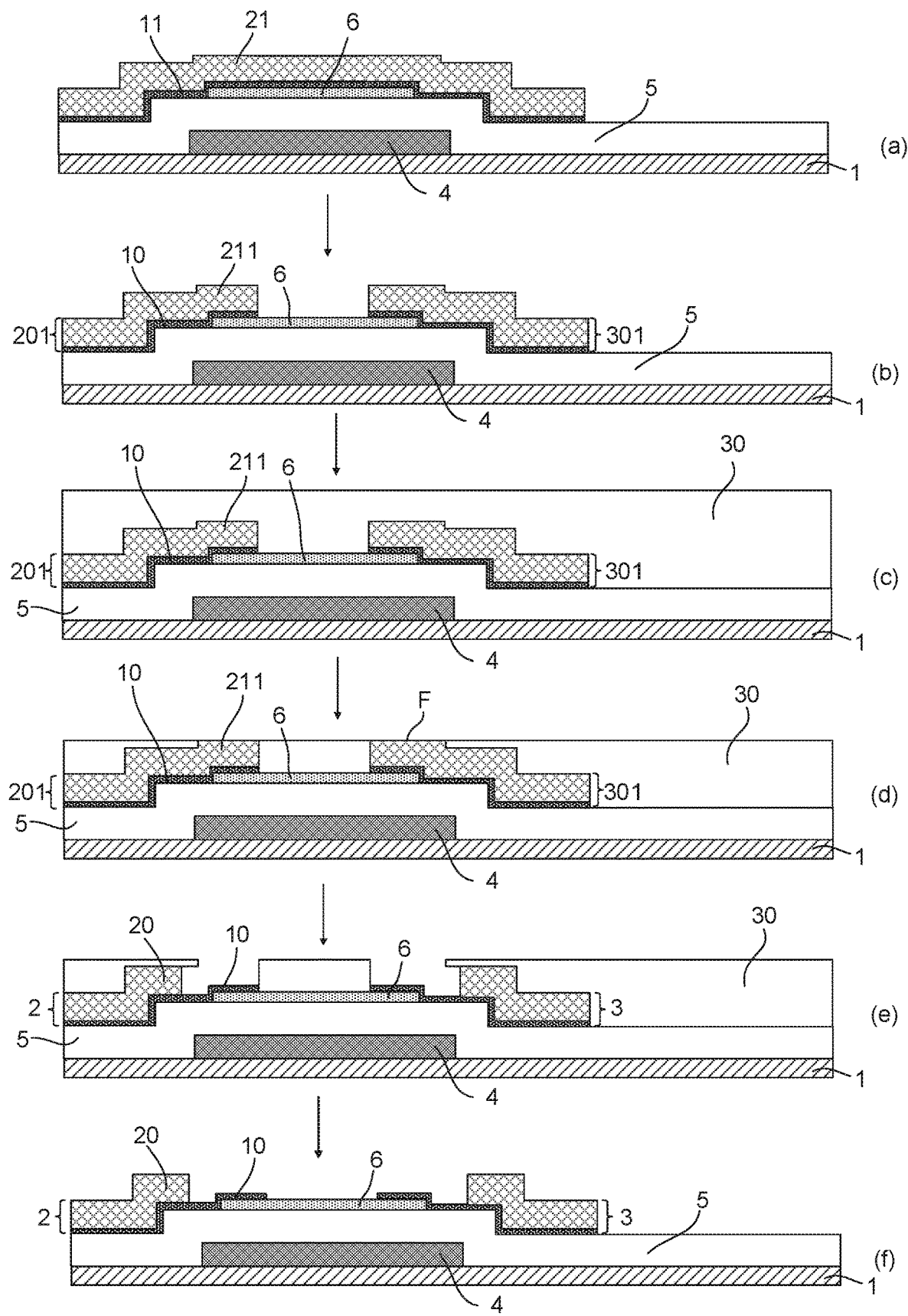
FIG. 15 is a schematic diagram showing steps of a method for manufacturing a thin film transistor according to some embodiments of the present disclosure.

On this basis, in some embodiments, as for the thin film transistor 200 shown in FIG. 3a, referring to FIGS. 14 and 15, S102 includes the following steps.

In S1021, referring to (a) and (b) in FIG. 15, a first conductive layer 11 and a second conductive layer 21 are sequentially formed on the substrate 1 on which the active layer 6 has been formed, and the first conductive layer 11 and the second conductive layer 21 are patterned through a first patterning process to form an initial source 201 and an initial drain 301. Each of the initial source 201 and the initial drain 301 includes the first sub-electrode 10 formed out of the first conductive layer 11 and an initial second sub-electrode 211 formed out of the second conductive layer 21.

In S1022, referring to (c) and (d) in FIG. 15, an etch stop layer 30 is formed on the substrate 1 on which the initial source 201 and the initial drain 301 have been formed, and the etch stop layer 30 is ground through a grinding process or is patterned through a second patterning process to expose a surface F of a portion, which overlaps the active layer 6, of the initial second sub-electrode 211 of each of the initial source 201 and the initial drain 301.

Herein, that "a portion, which overlaps the active layer 6, of the initial second sub-electrode 211" refers to a portion of the initial second sub-electrode 211 corresponding to an overlapping region between an orthographic projection of the initial second sub-electrode 211 on the substrate 1 and the orthographic projection of the active layer 6 on the substrate 1.

In S1023, referring to (e) in FIG. 15, the initial second sub-electrodes 11 of the initial source 201 and the initial drain 301 are etched from the exposed surfaces F of the initial second sub-electrodes 211 through an etching process, so as to form the source 2 and the drain 3. Each of the source 2 and the drain 3 includes the first sub-electrode 10 and the second sub-electrode 20 that is formed out of the initial second sub-electrode 211.

In a case where the etch stop layer 30 is ground through the grinding process in S1022, in the thin film transistor 200 shown in FIG. 3*a*, the gate 4 and the active layer 6 are located below the source 2 and the drain 3, which makes the above-described surface F protrude from an upper surface of a remaining portion of the initial second sub-electrode 211. In this way, during the grinding process of the etch stop layer 30 in S1023, there is still the etch stop layer 30 existing on the surface of the remaining portion of the initial second sub-electrode 211 when the surface F is exposed due to the etch stop layer 30 on the surface F being ground. Therefore, during the etching process in which the initial second sub-electrode 211 is etched from the exposed surface F of the initial second sub-electrode 211 in S1023, the surface of the remaining portion of the initial second sub-electrode 211 will not be etched due to the protection of the tech stop layer 30.

In addition, in the case where the grinding process is used, a patterning process may be omitted, which simplifies processes and reduces manufacturing costs.

For example, the etch stop layer 30 is made of a silicon dioxide ($SiO_2$), photoresist or other materials that can prevent etching by the etching liquid.

In some embodiments, in a case where the etch stop layer is ground through the grinding process, the grinding process includes at least one of a chemical grinding process and a mechanical grinding process. For example, when the etch stop layer 30 is ground, a chemical grinding process may be used, or a mechanical grinding process may be used, or a combination of the chemical grinding process and the mechanical grinding process may be used.

For example, grinding the etch stop layer 30 through the chemical grinding process includes: impregnating a portion of the etch stop layer 30 corresponding to the surface F with grinding liquid (including grinding particles, water and an additive), to make the surface F be exposed.

For example, grinding the etch stop layer 30 through the combination of the chemical grinding process and the mechanical grinding process includes: grinding the etch stop layer 30 with grinding liquid (including grinding particles, water and an additive), to make the above-described surface F be exposed. The grinding particles in the grinding liquid may include silicon dioxide particles, aluminum oxide particles or the like, and the additive may be used to adjust viscosity of the grinding liquid.

In some embodiments, during the etching process in which the initial second sub-electrodes 211 of the initial source 01 and the initial drain 301 are etched in S1023, the etching liquid used is capable of reacting with the initial second sub-electrode 211 and is not capable of reacting with the first sub-electrode 10. In this way, the etching liquid is ensured to etch only the initial second sub-electrode 211 without affecting the first sub-electrode 10.

Exemplarily, in an example where a material of the first conductive layer 11 is titanium and a material of the second conductive layer 21 is copper, $H_2O_2$ may be used as the etching liquid.

Herein, it will be noted that, in an etching process of a related technology, a certain amount of fluoride is usually added into $H_2O_2$ etching liquid to enhance the etching performance of $H_2O_2$ on a metal conductive layer. However, in the foregoing embodiments of the present disclosure, in order to prevent the etching liquid from damaging the first conductive layer 11 during the etching process of the second conductive layer 21, optionally, the etching liquid is $H_2O_2$ etching liquid without fluoride.

In some embodiments, during the etching process of the initial second sub-electrodes 211 of the initial source 201 and the initial drain 301 in S1023, by controlling etching parameter(s), the distance from the edge, which is proximate to the non-contact portion 63, of the second sub-electrode 10 of each of the formed source 2 and drain 3 of the active layer 6 to the non-contact portion 63 is 2 μm to 7 μm. The etching parameter(s) include at least one of an etching rate and an etching time.

In some embodiments, after S1023, S102 further includes the following step.

In S1024, referring to FIG. 14 and (f) in FIG. 15, the etch stop layer 30 remained is striped through a stripping process, in order to perform subsequent manufacturing processes.

It will be noted that, in a case where the requirement that the surfaces F of the portions of the second sub-electrodes 211 overlapping the active layer 6 protrude from the upper surfaces of the remaining portions of the initial second sub-electrodes 211 is met, the foregoing method for manufacturing the thin film transistor may also be used for other types of thin film transistors to form their sources and drains.

In addition, some embodiments of the present disclosure further provide another method for manufacturing a thin film transistor, which can form a source and a drain of a top-gate thin film transistor, a bottom-gate thin film transistor or the like. The method includes the following steps.

A first conductive layer is formed above a substrate, and first sub-electrodes of a source and a drain are formed through a third patterning process. Then a second metal film is formed on the substrate above which the first sub-electrodes have been formed, and second sub-electrodes of the source and the drain are formed through a fourth patterning process.

In other words, the first sub-electrodes 10 and the second sub-electrodes 20 of the source 2 and the drain 3 are formed through two different patterning processes. In the patterning processes, different masks may be used based on actual needs to form required pattern film layers, so that the method can be applied to form the source 2 and the drain 3 of the top-gate thin film transistor, the bottom-gate thin film transistor or the like.

In some embodiments, referring to FIG. 11, in an example where the array substrate 01 including the thin film transistors 200 is to be formed, after the thin film transistors 200 are manufactured, a passivation layer 220, pixel electrodes 210 connected to the drains 3 through via holes in the passivation layer 220 respectively and the like may be sequentially formed on a side of the thin film transistors 200 away from the substrate 1. Herein, the passivation layer 220 may be replaced by a planarization layer.

It will be noted that sequence numbers of the steps (such as S101 and S102) mentioned in the foregoing embodiments do not represent any order, and the order of the steps may be adjusted according to an actual situation during manufacturing.

Certainly, as for other related contents in the manufacturing method, reference may be made to the text description of corresponding parts in the embodiments of the thin film transistor, and details will not be repeated here again. As for manufacturing the thin film transistor with other arrangements and structures in the embodiments, reference may be made to the foregoing manufacturing method, or the manufacturing steps may be adjusted correspondingly. Details will not be repeated here again.

The foregoing descriptions are merely specific implementations of the present disclosure, but the protection scope of the present disclosure is not limited thereto. Any person of skill in the art could readily conceive of changes or replacements within the technical scope disclosed by the present disclosure, which shall all be included in the protection scope of the present disclosure. Therefore, the protection scope of the present disclosure shall be subject to the protection scope of the claims.

What is claimed is:

1. A thin film transistor, comprising a substrate, an active layer disposed on the substrate, and a source and a drain that are in electrical contact with the active layer, wherein the source and the drain each include a first sub-electrode and a second sub-electrode that are stacked along a thickness of the active layer, and the first sub-electrode is closer to the active layer relative to the second sub-electrode; and
   an area of an overlapping region between an orthographic projection of the second sub-electrode of at least one of the source and the drain on the substrate and an orthographic projection of the active layer on the substrate is less than an area of an overlapping region between an orthographic projection of the first sub-electrode of the at least one of the source and the drain on the substrate and the orthographic projection of the active layer on the substrate;
   the active layer includes: a first contact portion in electrical contact with the first sub-electrode of the source, a second contact portion in electrical contact with the first sub-electrode of the drain and a non-contact portion located between the first contact portion and the second contact portion;
   a distance, in a first direction, between an edge of the second sub-electrode of the source proximate to the non-contact portion and an edge of the second sub-electrode of the drain proximate to the non-contact portion is greater than a length of the non-contact portion in the first direction;
   the first direction is a direction parallel to the substrate and pointing to the second contact portion from the first contact portion;
   a distance, in the first direction, from an edge of the second sub-electrode of the at least one of the source and the drain proximate to the non-contact portion to an edge of the non-contact portion proximate to the second sub-electrode of the at least one of the source and the drain is 2 μm to 7 μm;
   a distance, in the first direction, from the edge of the second sub-electrode of at least one of the source and the drain proximate to the non-contact portion to the edge of the non-contact portion proximate to the second sub-electrode of the at least one of the source and the drain is greater than or equal to a length of a corresponding contact portion in the first direction, wherein the corresponding contact portion is a contact portion of the first contact portion and the second contact portion closest to the second sub-electrode.

2. The thin film transistor according to claim 1, wherein a distance, in the first direction, from any position on the edge of the second sub-electrode of the at least one of the source and the drain proximate to the non-contact portion to the edge of the non-contact portion proximate to the second sub-electrode of the at least one of the source and the drain is equal.

3. The thin film transistor according to claim 2, wherein in a case where in the first direction, the distance from any position on the edge of the second sub-electrode of the source proximate to the non-contact portion to an edge of the non-contact portion proximate to the second sub-electrode of the source is equal, and the distance from any position on the edge of the second sub-electrode of the drain proximate to the non-contact portion to an edge of the non-contact portion proximate to the second sub-electrode of the drain is equal,
   in the first direction, the distance from the edge of the second sub-electrode of the source proximate to the non-contact portion to the edge of the non-contact portion proximate to the second sub-electrode of the source is equal to the distance from the edge of the second sub-electrode of the drain proximate to the non-contact portion to the edge of the non-contact portion proximate to the second sub-electrode of the drain.

4. The thin film transistor according to claim 1, wherein the second sub-electrode of the at least one of the source and the drain has at least one hollow-out region, and an orthographic projection of the at least one hollow-out region on the substrate is within a range of the orthographic projection of the active layer on the substrate.

5. The thin film transistor according to claim 1, wherein the thin film transistor further comprises a gate and a gate insulating layer, along a direction pointing to the active layer from the substrate, the gate and the gate insulating layer are sequentially disposed between the substrate and the active layer.

6. The thin film transistor according to claim 1, wherein a material of the second sub-electrode includes at least one of copper, aluminum and silver.

7. An array substrate, comprising the thin film transistor according to claim 1.

8. A display device, comprising the array substrate according to claim 7.

9. A method for manufacturing a thin film transistor, the method comprising:
   forming an active layer above a substrate; and
   forming a source and a drain on the substrate above which the active layer has been formed, wherein
   the source and the drain are separately in electrical contact with the active layer; the source and the drain each include a first sub-electrode and a second sub-electrode that are stacked along a thickness of the active layer, and the first sub-electrode is closer to the active layer relative to the second sub-electrode;
   an area of an overlapping region between an orthographic projection of the second sub-electrode of at least one of the source and the drain and an orthographic projection of the active layer on the substrate is less than an area of an overlapping region between an orthographic projection of the first sub-electrode of the at least one of the source and the drain and the orthographic projection of the active layer on the substrates;

the active layer includes: a first contact portion in electrical contact with the first sub-electrode of the source, a second contact portion in electrical contact with the first sub-electrode of the drain and a non-contact portion located between the first contact portion and the second contact portion;

a distance, in a first direction, from an edge of the second sub-electrode of at least one of the source and the drain proximate to the non-contact portion to an edge of the non-contact portion proximate to the second sub-electrode of the at least one of the source and the drain is greater than or equal to a length of a corresponding contact portion in the first direction, wherein the first direction is a direction parallel to the substrate and pointing to the second contact portion from the first contact portion;

the corresponding contact portion is a contact portion of the first contact portion and the second contact portion closest to the second sub-electrode;

forming the source and the drain on the substrate above which the active layer has been formed includes:

sequentially forming a first conductive layer and a second conductive layer on the substrate above which the active layer has been formed;

patterning the first conductive layer and the second conductive layer through a first patterning process to form an initial source and an initial drain, wherein the initial source and the initial drain each include a first sub-electrode formed out of the first conductive layer and an initial second sub-electrode formed out of the second conductive layer;

forming an etch stop layer on the substrate on which the initial source and the initial drain have been formed;

grinding the etch stop layer though a grinding process, or patterning the etch stop layer through a second patterning process, so as to expose surfaces of portions, which overlap the active layer, of initial second sub-electrodes of the initial source and the initial drain; and etching the initial second sub-electrodes of the initial source and the initial drain respectively through the exposed surfaces through an etching process to form the source and the drain, wherein the source and the drain each include the first sub-electrode and the second sub-electrode that is formed out of the initial second sub-electrode;

in a process of etching the initial second sub-electrodes of the initial source and the initial drain, by controlling etching parameters, a distance, in a direction pointing to the second sub-electrode of the source from the second sub-electrode of the drain, from each of edges of the second sub-electrodes of the source and the drain formed proximate to a non-contact portion of the active layer that is not in contact with first sub-electrodes of the source and the drain to a corresponding edge of the non-contact portion proximate to a corresponding second sub-electrode in the source and the drain is 2 µm to 7 µm; and the etching parameters include at least one of an etching rate and an etching time.

10. The method for manufacturing the thin film transistor according to claim 9, wherein before forming the active layer above the substrate, the method further comprises:

forming a gate and a gate insulating layer on the substrate sequentially.

11. The method for manufacturing the thin film transistor according to claim 9, wherein in a case where the etch stop layer is ground through the grinding process, the grinding process includes at least one of a chemical grinding process and a mechanical grinding process.

12. The method for manufacturing the thin film transistor according to claim 9, wherein in a process of etching the initial second sub-electrodes of the initial source and the initial drain, an etching liquid used is capable of reacting with the initial second sub-electrode but not with the first sub-electrode.

13. The method for manufacturing the thin film transistor according to claim 9, wherein forming the source and the drain on the substrate above which the active layer has been formed includes:

forming a first conductive layer on the substrate above which the active layer has been formed;

patterning the first conductive layer through a third patterning process to form the first sub-electrodes of the source and the drain;

forming a second conductive layer on the substrate on which the first sub-electrodes of the source and the drain have been formed; and patterning the second conductive layer through a fourth patterning process to form the second sub-electrodes of the source and the drain.

* * * * *